United States Patent
Kwon et al.

(10) Patent No.: US 8,030,150 B2
(45) Date of Patent: Oct. 4, 2011

(54) METHOD OF FABRICATING NON-VOLATILE MEMORY INTEGRATED CIRCUIT DEVICE AND NON-VOLATILE MEMORY INTEGRATED CIRCUIT DEVICE FABRICATED USING THE SAME

(75) Inventors: Byoung-ho Kwon, Suwon-si (KR);
Chang-ki Hong, Seongnam-si (KR);
Bo-un Yoon, Seoul (KR); Jun-yong Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 342 days.

(21) Appl. No.: 12/397,543

(22) Filed: Mar. 4, 2009

(65) Prior Publication Data
US 2009/0159952 A1    Jun. 25, 2009

Related U.S. Application Data

(62) Division of application No. 11/763,137, filed on Jun. 14, 2007, now Pat. No. 7,535,052.

(30) Foreign Application Priority Data

Jul. 19, 2006 (KR) .............................. 2006-0067480

(51) Int. Cl.
*H01L 21/8238* (2006.01)
(52) U.S. Cl. ................ 438/201; 438/211; 257/E21.179; 257/E21.422

(58) Field of Classification Search .................. 438/201, 438/211, 257, 593; 257/E21.179, E21.422, 257/E21.68
See application file for complete search history.

(56) References Cited

U.S. PATENT DOCUMENTS 7,696,035 B2 *  4/2010  Mokhlesi .................... 438/211
* cited by examiner

*Primary Examiner* — Hoai V Pham
(74) *Attorney, Agent, or Firm* — F. Chau & Associates, LLC

(57) ABSTRACT

A method of fabricating a non-volatile memory integrated circuit device and a non-volatile memory integrated circuit device fabricated by using the method are provided. A device isolation region is formed in a substrate to define a cell array region and a peripheral circuit region. A plurality of first and second pre-stacked gate structures is formed in the cell array region, and each has a structure in which a lower structure, a conductive pattern and a first sacrificial layer pattern are stacked. Junction regions are formed in the cell array region. Spacers are formed on side walls of the first and second pre-stacked gate structures. A second sacrificial layer pattern filling each space between the second pre-stacked gate structures is formed. The first sacrificial layer pattern is removed from each of the first and second pre-stacked gate structures. A damascene metal layer pattern is formed in each of spaces of the first and second pre-stacked gate structures from which the first sacrificial layer pattern is removed, thus completing first and second stacked gate structures. The second sacrificial layer pattern is removed. A stop layer is formed on top surfaces of the first stacked gate structures, top surfaces and side walls of the second stacked gate structures, and a top surface of the substrate.

4 Claims, 11 Drawing Sheets

METHOD OF FABRICATING NON-VOLATILE MEMORY INTEGRATED CIRCUIT DEVICE AND NON-VOLATILE MEMORY INTEGRATED CIRCUIT DEVICE FABRICATED USING THE SAME

CROSS-REFERENCE TO RELATED APPLICATION

This application is a divisional of U.S. patent application Ser. No. 11/763,137, filed on Jun. 14, 2007 now U.S. Pat. No. 7,535,052, which, in turn, claims priority from Korean Patent Application No. 10-2006-0067480, filed on Jul. 19, 2006, the disclosures of which are all incorporated by reference herein in their entireties.

BACKGROUND OF THE INVENTION

1. Technical Field

The present disclosure relates to a method of fabricating a non-volatile memory integrated circuit device and to a non-volatile memory integrated circuit device fabricated by using the method.

2. Description of the Related Art

Non-volatile memory integrated circuit devices can retain stored data even after the supply of power has been interrupted. As such, non-volatile memory integrated circuit devices are widely used in information communication devices, such as, for example, digital cameras, mobile phones, Personal Digital Assistants (PDA), or MPEG3 layer (MP3) players.

However, as information communication devices are moving more and more toward having expanded multi-functions, higher capacity and higher integration for non-volatile memory integrated circuit devices may now be required. Accordingly, the size of each memory cell constituting a non-volatile semiconductor integrated circuit device has rapidly decreased. With the decrease in the size of the memory cell, the width of a word line has also decreased, thereby increasing electrical resistance. The increased electrical resistance of the word line may also increase the resistance-capacitance (RC) delay of the word line in a read operation. As a result, the time required to read information from a selected cell, that is, the access time, may also increase. Therefore, to reduce the resistance of the word line, an attempt to form a word line as a dual-layer composed of a polysilicon pattern and a metal layer pattern has been made.

SUMMARY OF THE INVENTION

Exemplary embodiments of the present invention provide a method of fabricating a non-volatile memory integrated circuit device, in which word lines are formed using a damascene process.

Exemplary embodiments of the present invention provide a non-volatile memory integrated circuit device, which is fabricated using the fabricating method.

In accordance with an exemplary embodiment of the present invention a method of fabricating a non-volatile memory integrated circuit device is provided. The method includes forming a device isolation region in a substrate, thus defining a cell array region and a peripheral circuit region, forming a plurality of first and second pre-stacked gate structures in the cell array region, the first and second pre-stacked gate structures each having a structure in which a lower structure, a conductive pattern and a first sacrificial layer pattern are stacked. The first and second pre-stacked gate structures being formed so that a first pitch between neighboring first pre-stacked gate structures and a second pitch between neighboring first and second pre-stacked gate structures are narrower than a third pitch between neighboring second pre-stacked gate structures. The method further includes forming a plurality of junction regions in the cell array region exposed by the first and second pre-stacked gate structures, and forming a plurality of spacers on side walls of the first and second pre-stacked gate structures, the spacers being formed so that spacers between the first pre-stacked gate structures are connected to each other and spacers between the first and second pre-stacked gate structures are connected to each other, but spacers between the second pre-stacked gate structures are separated from each other. The method further includes forming a second sacrificial layer pattern to fill each space between the second pre-stacked gate structures, removing the first sacrificial layer pattern from each of the first and second pre-stacked gate structures, forming a damascene metal layer pattern in each of spaces of the first and second pre-stacked gate structures from which the first sacrificial layer pattern is removed, thus completing first and second stacked gate structures, removing the second sacrificial layer pattern, and forming a stop layer on top surfaces of the first stacked gate structures, top surfaces and side walls of the second stacked gate structures, and a top surface of the substrate.

In accordance with an exemplary embodiment of the present invention, a method of fabricating a non-volatile memory integrated circuit device is provided. The non-volatile memory integrated circuit device includes forming a device isolation region in a substrate, thus defining a cell array region and a peripheral circuit region, forming a plurality of first and second pre-stacked gate structures in the cell array region, the first and second pre-stacked gate structures each having a structure in which a lower structure, a conductive pattern and a sacrificial layer pattern are stacked. The first and second pre-stacked gate structures being formed so that a first pitch between neighboring first pre-stacked gate structures and a second pitch between neighboring first and second pre-stacked gate structures are narrower than a third pitch between neighboring second pre-stacked gate structures. The method further includes forming a plurality of junction regions in the cell array region exposed by the first and second pre-stacked gate structures, forming a plurality of spacers on side walls of the first and second pre-stacked gate structures. The spacers being formed so that spacers between the first pre-stacked gate structures are connected to each other and spacers between the first and second pre-stacked gate structures are connected to each other, but spacers between the second pre-stacked gate structures are separated from each other. The method further includes forming a first stop layer pattern and an interlayer dielectric pattern in each space between the second pre-stacked gate structures, removing the sacrificial layer pattern from each of the first and second pre-stacked gate structures, forming a damascene metal layer pattern in each of spaces of the first and second pre-stacked gate structures from which the sacrificial layer pattern is removed, thus completing first and second stacked gate structures, and forming a second stop layer on top surfaces of the first and second stacked gate structures and a top surface of the interlayer dielectric pattern.

In accordance with an exemplary of the present invention, a non-volatile memory integrated circuit device is provided. The method includes a substrate in which a cell array region and a peripheral circuit region are defined by a device isolation region and a plurality of first and second stacked gate structures formed in the cell array region. The first and second stacked gate structures each having a structure in which a lower structure, a conductive pattern and a damascene metal layer pattern are stacked. The first and second stacked gate structures being formed so that a first pitch between neighboring first stacked gate structures, and a second pitch between neighboring first and second stacked gate structures are narrower than a third pitch between neighboring second stacked gate structures. The device further includes a plurality of junction regions formed in the cell array region exposed by the first and second stacked gate structures, and a plurality of spacers formed on side walls of the first and second stacked gate structures. The spacers being formed so that spacers between the first stacked gate structures are connected to each other and spacers between the first and second stacked gate structures are connected to each other, but spacers between the second stacked gate structures are separated from each other. The device further includes a stop layer formed on top surfaces of the first stacked gate structures, top surfaces and side walls of the second stacked gate structures, and a top surface of the substrate.

In accordance with an exemplary embodiment of the present invention, a non-volatile memory integrated circuit device is provided. The non-volatile memory integrated circuit device includes a substrate in which a cell array region and a peripheral circuit region are defined by a device isolation region and a plurality of first and second stacked gate structures formed in the cell array region. The first and second stacked gate structures each having a structure in which a lower structure, a conductive pattern and a damascene metal layer pattern are stacked. The first and second stacked gate structures being formed so that a first pitch between neighboring first stacked gate structures and a second pitch between neighboring first and second stacked gate structures are narrower than a third pitch between neighboring second stacked gate structures. The device further includes a plurality of junction regions formed in the cell array region exposed by the first and second stacked gate structures, and a plurality of spacers formed on side walls of the first and second stacked gate structures. The spacers being formed so that spacers between the first stacked gate structures are connected to each other and spacers between the first and second stacked gate structures are connected to each other, but spacers between the second stacked gate structures are separated from each other. The device further includes a first stop layer pattern and an interlayer dielectric pattern formed in each space between the second stacked gate structures, and a second stop layer formed on top surfaces of the first and second stacked gate structures and a top surface of the interlayer dielectric pattern.

BRIEF DESCRIPTION OF THE DRAWINGS

Exemplary embodiments of the present invention can be more understood in more detail from the following detailed description taken in conjunction with the accompanying drawings, in which.

DESCRIPTION OF THE EXEMPLARY EMBODIMENTS

Figure 1:
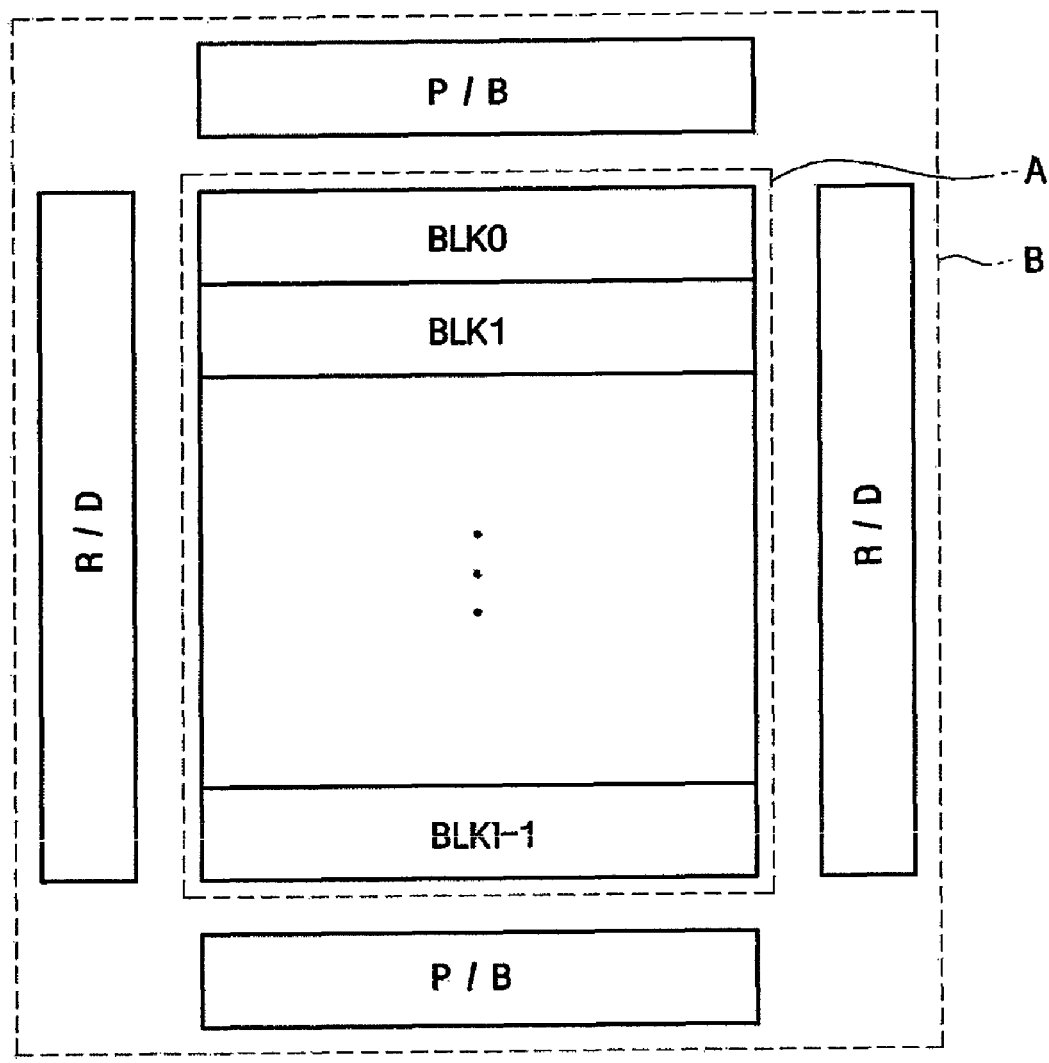
FIG. 1 is a block diagram of a (not and) NAND-type non-volatile memory integrated circuit device to which transistor structures according to exemplary embodiments of the present invention are applied.

However, the present invention is not limited to the exemplary embodiments that will be disclosed below, but may be implemented in various forms.

Hereinafter, reference now should be made to the drawings, in which the same reference numerals are used throughout the different drawings to designate the same or similar components. In the present specification, the term "and/or" means that respective items described and all combinations thereof are included. The terms "comprises" and/or "comprising" are each used to mean that the existence or addition of elements, steps, operations or devices other than described elements, steps, operations, or devices is not excluded. The terms used in the present specification are used to describe the exemplary embodiments, and are not intended to limit the present invention.

Hereinafter, exemplary embodiments of the present invention will be described in detail with reference to the attached drawings.

Figure 2:
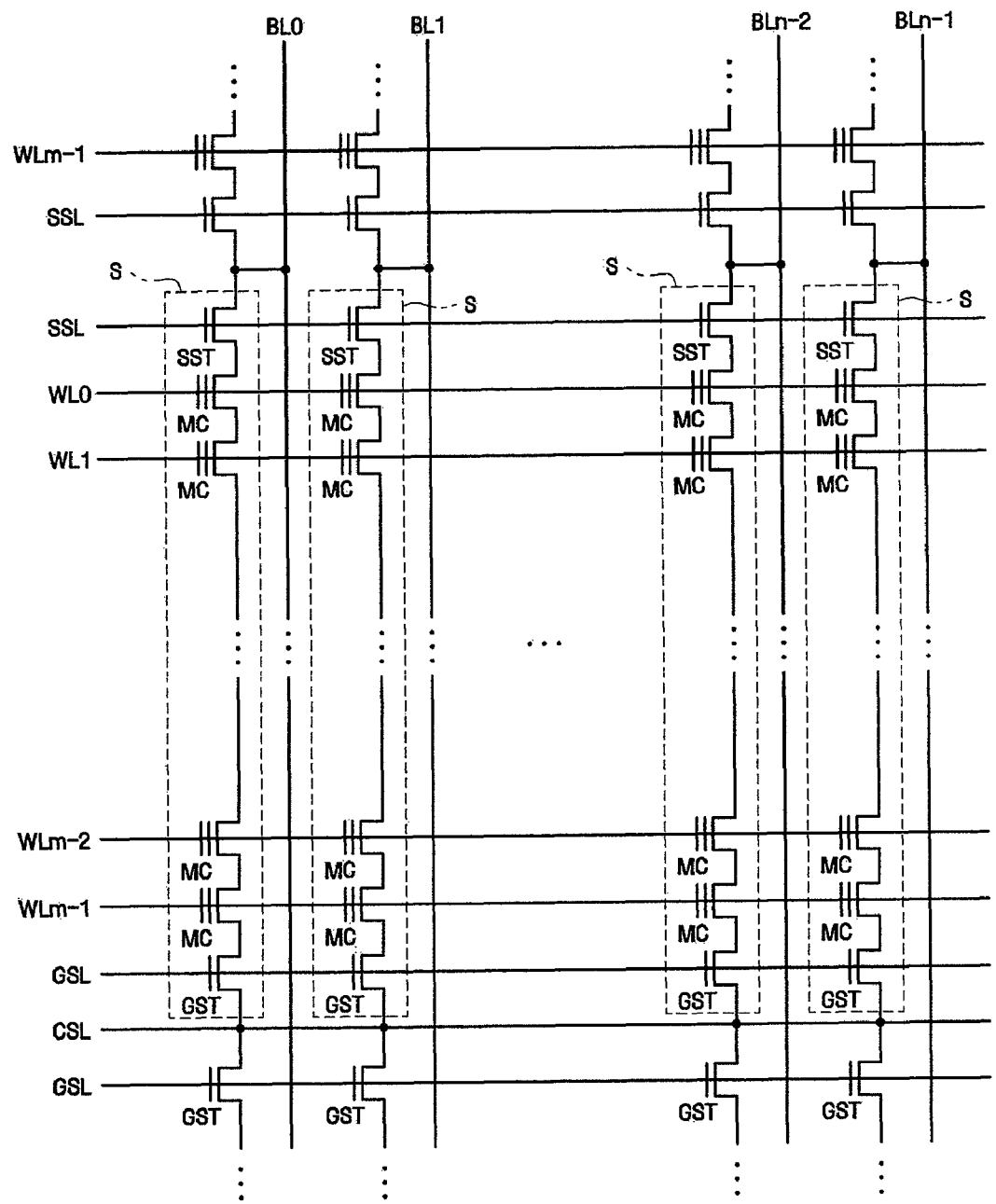
FIG. 2 is a circuit diagram showing the cell array region of FIG. 1.

FIG. 1 is a block diagram of a (not and) NAND-type non-volatile memory integrated circuit device to which transistor structures according to exemplary embodiments of the present invention are applied. FIG. 2 is a circuit diagram showing the cell array region of FIG. 1, and FIG. 3 is a diagram showing the layout of the cell array region of FIG. 1.

Figure 3:
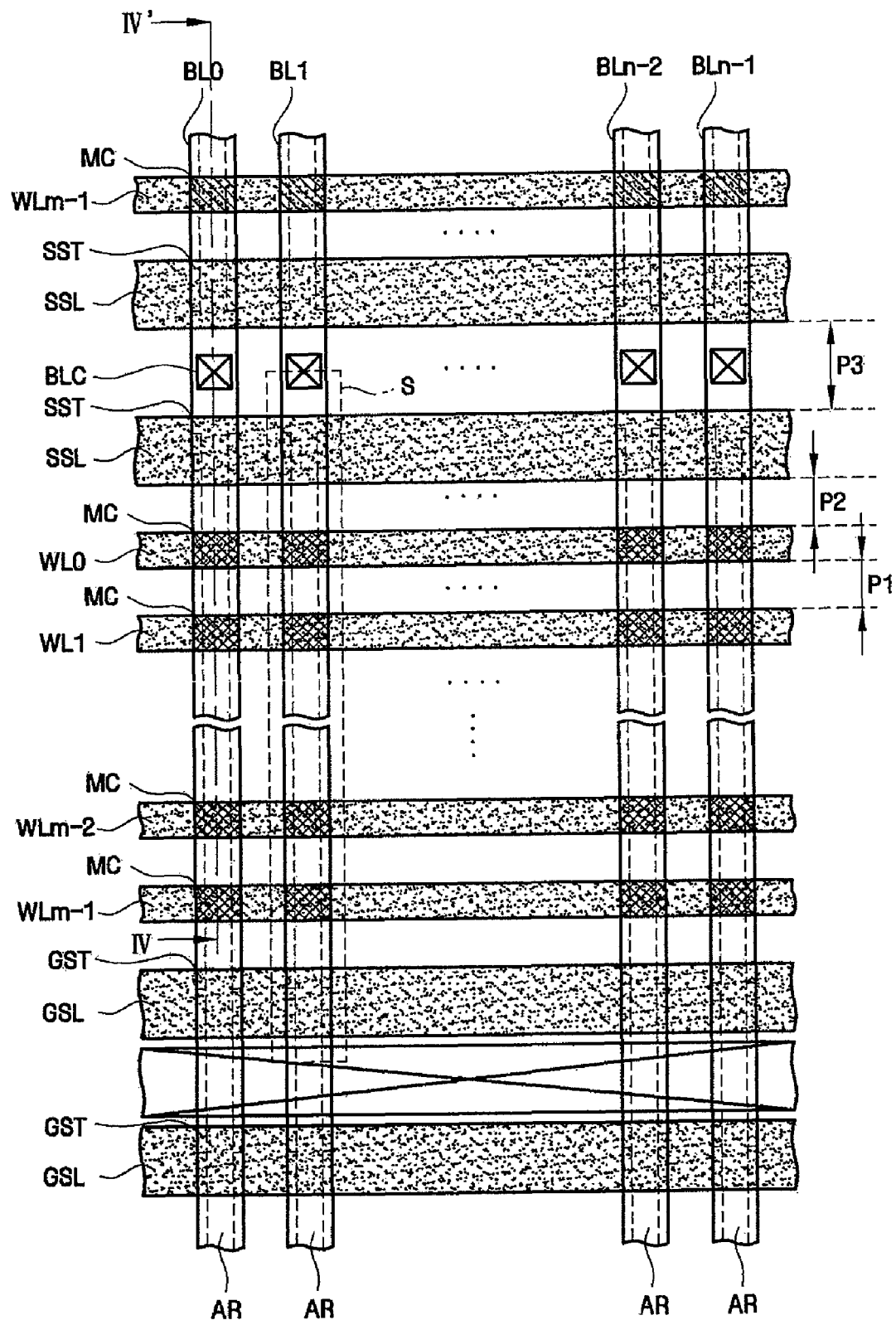
FIG. 3 is a diagram showing the layout of the cell array region of FIG. 1.

Referring to FIGS. 1 to 3, in the cell array region A of a NAND-type non-volatile memory integrated circuit device, a plurality of cell blocks BLK0 to BLK1-1 is repeatedly arranged. A plurality of active regions AR is arranged in each of the cell blocks BLK0 to BLK1-1. String selection lines SSL, ground selection lines GSL, and common source lines CSL are arranged to be perpendicular to the active regions AR. A plurality of word lines WL0 to WLm-1 is arranged between a string selection line SSL and a ground selection line GSL. Further, a plurality of bit lines BL0 to BLn-1 is arranged to intersect the plurality of word lines WL0 to WLm-1. On the regions at which the bit lines BL0 to BLn-1 and the word lines WL0 to WLm-1 intersect each other, respective memory cell transistors MC are defined. On the regions at which the bit lines BL0 to BLn-1 intersect the string selection line SSL and the ground selection line GSL, string selection transistors SST and ground selection transistors GST are defined, respectively. A single string selection transistor SST, a plurality of memory cell transistors MC and a single ground selection transistor GST are connected in series, thus forming a single string S. The strings S formed in each cell block BLK0 to BLK1-1 are connected in parallel with respective bit lines BL. That is, the drain of the string selection transistor SST of each string S is connected to the bit line BL. The source of the ground selection transistor GST is connected to the common source line CSL.

Page buffers P/B are arranged in the upper and lower portions of a peripheral circuit region B, and row decoders R/D are arranged in left and right portions of the peripheral circuit region B.

Figure 4:
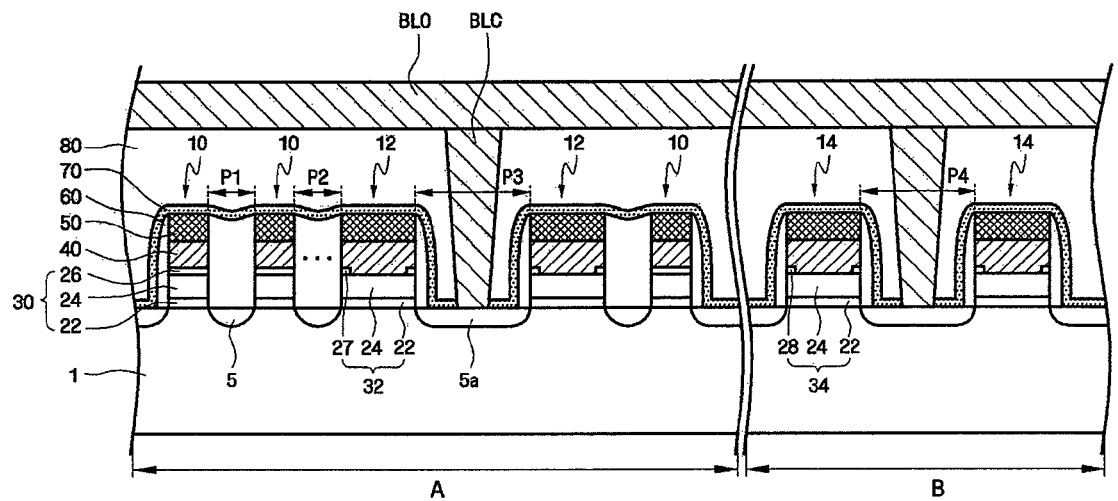
FIG. 4 is a sectional view of a non-volatile memory integrated circuit device formed based on the circuit diagram and the layout of FIGS. 2 and 3 according to an exemplary embodiment of the present invention.

FIG. 4 is a sectional view of a non-volatile memory integrated circuit device formed based on the circuit diagram and the layout of FIGS. 2 and 3 according to an embodiment of the present invention. In this case, the cell array region A of FIG. 4 denotes a section taken along line IV-IV' of FIG. 3.

Referring to FIGS. 2 to 4, the cell array region A and the peripheral circuit region B are defined by a shallow trench device isolation region formed in a substrate 1. A plurality of active regions AR is repeatedly arranged in the cell array region A. The substrate 1 can be made of one or more selected from among semiconductor materials, such as, for example, silicon (Si), germanium (Ge), silicon germanium (SiGe), gallium phosphide (GaP), gallium arsenide (GaAs), silicon carbide (SiC), silicon germanium carbide (SiGeC), indium arsenide (InAs) and indium phosphide (InP), but is not limited to the above materials. Further, a Silicon-On-Insulator (SOI) substrate can be used as the substrate 1. Further, a plurality of wells can be formed in the substrate 1 so as to optimize the characteristics of transistors formed both in the cell array region A and in the peripheral circuit region B. For example, a pocket P-type well is formed in the cell array region, and an N-type well and a P-type well can be separately formed in the peripheral circuit region.

A plurality of first and second stacked gate structures 10 and 12 is formed in the cell 10 array region A, and a plurality of third stacked gate structures 14 is formed in the peripheral circuit region B. Each of the first stacked gate structures 10 may correspond to the gate of a memory cell transistor MC, and each of the second stacked gate structures 12 may correspond to the gate of a string selection transistor SST or the gate of a ground selection transistor GST. Each of the third stacked gate structures 14 may correspond to the gate of a driving transistor formed in the peripheral circuit region B.

For example, a first pitch P1 between neighboring first stacked gate structures 10, and a second pitch P2 between neighboring first and second stacked gate structures 10 and 12 can be narrower than a third pitch P3 between neighboring second stacked gate structures 12. Further, the first pitch P1 between neighboring first stacked gate structures 10 can be narrower than a fourth pitch P4 between neighboring third stacked gate structures 14. In this case, the pitch between two neighboring stacked gate structures (for example, the pitch between neighboring first and second stacked gate structures 10 and 12) is defined by the shortest distance from the edge of a single stacked gate structure (for example, the first stacked gate structure 10) to the edge of another stacked gate structure (for example, the second stacked gate structure 12).

Each of the first and second stacked gate structures 10 and 12 has a structure in which a lower structure 30 or 32, a conductive pattern 40 and a damascene metal layer pattern 50 are sequentially stacked. A dual-layer of the conductive pattern 40 and the damascene metal layer pattern 50 formed in the cell array region A corresponds to the word line (WL0 to WLm-1 of FIG. 3) that extends in one direction. Further, each of the third stacked gate structures 14 can have a structure in which a lower structure 34, the conductive pattern 40 and the damascene metal layer pattern 50 are sequentially stacked.

As shown in FIG. 4, the heights of the first to third stacked gate structures 10, 12 and 14 may be substantially similar to each other, but need not be similar to each other. However, for example, when the heights of the first to third stacked gate structures 10, 12 and 14 are substantially similar to each other, the detection of an end point can be readily performed in a Chemical Mechanical Polishing (CMP) process when a second sacrificial layer pattern is formed (refer to FIG. 6C), when a first stop layer pattern and a first interlayer dielectric pattern are formed (refer to FIG. 7C), and when the damascene metal layer pattern 50 is formed (refer to FIG. 6F and FIG. 7D).

The lower structure 30 of each first stacked gate structure 10 has a structure in which a first dielectric layer 22, a charge storage layer pattern 24, and a second dielectric layer 26 are sequentially stacked, and thus the charge storage layer pattern 24 and the conductive pattern 40 are electrically connected through the second dielectric layer 26.

The first dielectric layer 22 of the first stacked gate structure 10 may be a single layer or a composite layer which is made of at least one material suitable for the tunneling of electrons, for example, silicon dioxide (SiO.sub.2), hafnium oxide (HfxOy), aluminum oxide (AlxOy), zirconium oxide (Zrxoy), tantalum oxide (TaxOy), hafnium silicate (HfxSil-xOy) and hafnium silicon oxynitride (HfxSil-xOyNz). However, the material of the first dielectric layer 22 is not limited to the above example. The thickness of the first dielectric layer 22 can be approximately 30 to 100.quadrature.

The charge storage layer pattern 24 of the first stacked gate structure 10 is a region in which electrons tunneling through the first dielectric layer 22 are stored. When a target non-volatile memory integrated circuit device to be fabricated is a floating gate device, the charge storage layer pattern 24 can be made of, for example, polysilicon doped with impurities. In contrast, when a target non-volatile memory integrated circuit device to be formed is a floating trap-type device, such as, for example, Metal Oxide Nitride Oxide Semiconductor (MONOS) or Silicon Oxide Nitride Oxide Semiconductor (SONOS), the charge storage layer pattern 24 can be made of a material in which electrons can be trapped, for example, silicon nitride (SiN), etc. In the case of the floating trap-type device, the charge storage layer pattern 24 is non-conductive, and can be formed to be lower than shown in the drawing.

The second dielectric layer 26 of the first stacked gate structure 10 is an inter-gate dielectric, and prohibits charges stored in the charge storage layer pattern 24 from moving to the conductive pattern 40 or the damascene metal layer pattern 50. For example, the second dielectric layer 26 may be a single layer or a composite layer made of at least one of materials, such as oxide/nitride oxide (ONO), $SiO_2$, HfxOy, AlxOy, ZrxOy, TaxOy, HfxSil-xOy, and HfxSil-xOyNz, but is not limited to the above materials. The thickness of the second dielectric layer 26 may be approximately 50 to 150□.

The conductive pattern 40 can be, for example, a polysilicon layer doped with impurities.

The damascene metal layer pattern 50 is a metal layer pattern formed through a damascene process, and can be made of a material such as, for example, tungsten (W), aluminum (Al), copper (Cu) or platinum (Pt), or may be a composite layer thereof.

Meanwhile, the lower structures 32 and 34 of the second and third stacked gate structures 12 and 14 can be formed so that the second dielectric layers 27 and 28 are partially removed (as shown in FIG. 4), or are completely eliminated, and thus the charge storage layer pattern 24 and the conductive pattern 40 can be electrically connected to each other. The materials required to form the first dielectric layer 22, the charge storage layer pattern 24, and the second dielectric layer 27 or 28, which constitute each of the lower structures 32 and 34 in the second and third stacked gate structures 12 and 14, and the thickness thereof may be identical to those in the first stacked gate structure 10. The materials required to form the conductive pattern 40 and the damascene metal layer pattern 50 of each of the second and third stacked gate structures 12 and 14 can also be identical to those of the first stacked gate structure 10.

Junction regions 5 are formed in the cell array region A, exposed by the first and second stacked gate structures 10 and 12. The plurality of first and second stacked gate structures 10 and 12 share the junction regions 5 with each other. For example, the string selection transistor SST, the plurality of memory cell transistors MC and the ground selection transistor GST are connected in series to share the junction regions 5 with each other, thus forming a string S. Further, each string S is connected to a bit line BL through a bit line junction region 5a, among the junction regions 5, and a bit line contact BLC. In particular, as shown in FIG. 4, the second stacked gate structures 12 of neighboring strings S, for example, string selection transistors SST, can be formed to share the bit line junction region 5a with each other.

Spacers 60 are formed on the side walls of the first and second stacked gate structures 10 and 12. In this case, the spacers 60 between the first stacked gate structures 10 are connected to each other, and the spacers 60 between the first and second stacked gate structures 10 and 12 are connected to each other, but the spacers 60 between the second stacked gate structures 12 are separated from each other. The reason for this is that the first pitch P1 between neighboring first stacked gate structures 10, and the second pitch P2 between neighboring first and second stacked gate structures 10 and 12 is narrower than the third pitch P3 between neighboring second stacked gate structures 12, as described above.

A Stop layer 70 is formed on the top surfaces of the first stacked gate structures 10, the top surfaces and side walls of the second stacked gate structures 12, and the top surface of the substrate 1, which is exposed by the first and second stacked gate structures 10 and 12. As the spacers 60 are formed in the space between the first stacked gate structures 10 and in the space between the first and second stacked gate structures 10 and 12, the stop layer 70 may not be formed above those spaces. Further, the stop layer 70 can also be formed on the top surfaces and side walls of the third stacked gate structures 14. The stop layer 70 can be implemented as a silicon nitride (SiN) layer or a silicon oxynitride (SiON) layer, and the thickness thereof can be about 500 Angstroms Å or less, for example, approximately 200 to 300 Å.

The stop layer 70 formed on the top surface of the substrate 1 (that is, the bit line junction region 5a) functions as an etch-stop layer during a dry etching process for forming a contact hole, which opens the bit line junction region 5a, in the interlayer dielectric 80.

Further, the stop layer 70, formed on the top surface of each first stacked gate structure 10 and the top surface and the side wall of each second stacked gate structure 12, functions as a passivation layer. That is, a high voltage is applied to the first and second stacked gate structures 10 and 12 of a NAND-type non-volatile memory integrated circuit device in operation. Due to this high voltage, mobile ions surrounding the first and second stacked gate structures 10 and 12 are attracted into the first and second stacked gate structures 10 and 12, so that the leakage of current may occur in the surroundings of the first and second stacked gate structures 10 and 12. Such a stop layer 70 prevents mobile ions from being attracted into the first and second stacked gate structures, thus preventing the electrical characteristics of the NAND-type non-volatile memory integrated circuit device from deteriorating.

Figure 5:
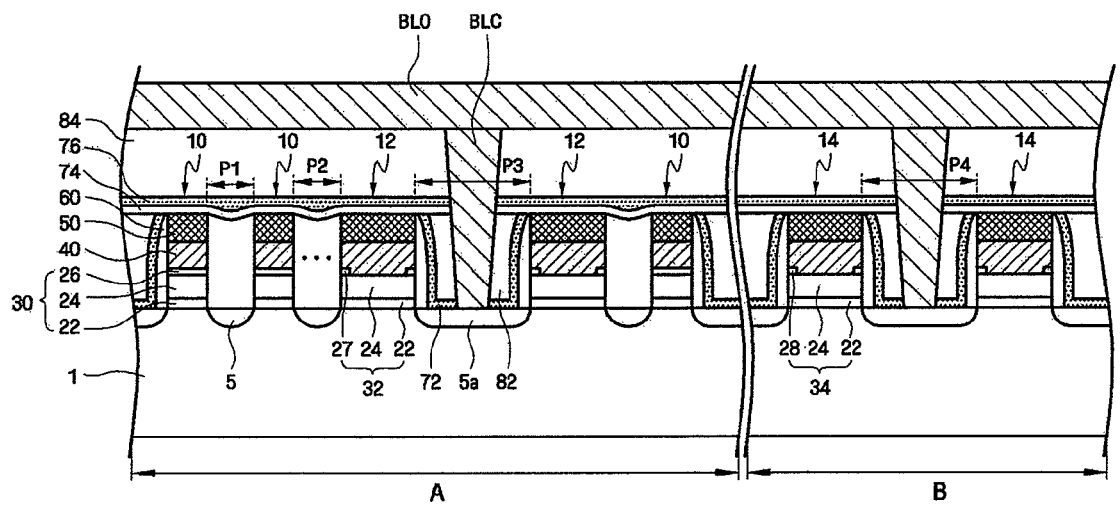
FIG. 5 is a sectional view of a non-volatile memory integrated circuit device according to an exemplary embodiment of the present invention.

FIG. 5 is a sectional view showing a non-volatile memory integrated circuit device according to another exemplary embodiment of the present invention. The same reference numerals are used to designate components substantially identical to those of FIG. 4, and thus a detailed description of the components is omitted.

Referring to FIG. 5, a non-volatile memory integrated circuit device according to another exemplary embodiment of the present invention is implemented so that a plurality of stop layers 72 and 76 can be formed between a substrate 1 and a bit line BL.

For example, a first stop layer pattern 72 may be formed in the space between second stacked gate structures 12, and in the space between third stacked gate structures 14. A first interlayer dielectric pattern 82 is formed on the first stop layer pattern 72 to fill the space between the second stacked gate structures 12. The second stop layer 76 is formed on the top surfaces of the first and second stacked gate structures 10 and 12 and the top surface of the first interlayer dielectric pattern 82. As spacers 60 are formed in the space between the first stacked gate structures 10 and the space between the first and second stacked gate structures 10 and 12, the second stop layer 76 may not be formed. Further, the second stop layer 76 can also be formed on the top surfaces.

The first stop layer pattern 72 functions as an etch-stop layer during a dry etching process of forming a contact hole, which opens a bit line junction region 5a, in the first interlayer dielectric pattern 82. The second stop layer 76 functions as a passivation layer for preventing current from leaking from the surroundings of the first and second stacked gate structures 10 and 12.

The first stop layer pattern 72 and the second stop layer 76 can be made of a Metal Oxide Nitride Oxide Semiconductor (MONOS) or a Silicon Oxide Nitride Oxide Semiconductor (SONOS) layer. The thickness thereof can be about 500 Å or less, for example, approximately 200 to 300 Å.

A non-volatile memory integrated circuit device according to a further embodiment of the present invention may further selectively include a buffer layer 74 that is formed on the top surfaces of the first and second stacked gate structures 10 and 12, on the top surface of the first interlayer dielectric pattern 82, and beneath the second stop layer 76. The buffer layer 74 can be implemented using an oxide film, for example, Middle Temperature Oxide (MTO), and the thickness thereof can be 1000□ or less. Such a buffer layer 74 functions to reduce stress that may occur between the damascene metal layer pattern 50 and the second stop layer 76.

Reference numeral 84, not described, denotes a second interlayer dielectric.

FIGS. 6A to 6H are sectional views showing a process of fabricating a non-volatile memory integrated circuit device according to an embodiment of the present invention. Hereinafter, fabricating processes which can be executed by processing steps well known to those skilled in the art will be described only briefly. Further, a description of the sizes, shapes and materials of the above-described components is omitted to avoid repetitive description.

Figure 6A:
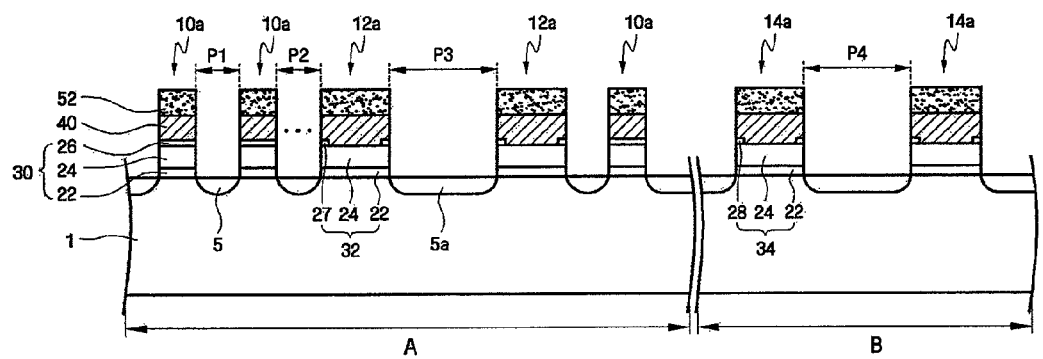
FIGS. 6A to 6H are sectional views showing a process of fabricating a non-volatile memory integrated circuit device according to an exemplary embodiment of the present invention.

Referring to FIG. 6A, a device isolation region is formed in a substrate 1, and thus a cell array region A and a peripheral circuit region B are defined.

Next, first and second pre-stacked gate structures 10a and 12a are formed in the cell array region A, and third pre-stacked gate structures 14a are formed in the peripheral circuit region B.

For example, a first pitch P1 between neighboring first pre-stacked gate structures 10a and a second pitch P2 between neighboring first and second pre-stacked gate structures 10a and 12a are formed to be narrower than a third pitch P3 between neighboring second pre-stacked gate structures 12a. Further, a fourth pitch P4 between neighboring third pre-stacked gate structures 14a can be formed to be wider than the first pitch P1 between the neighboring first pre-stacked gate structures 10a.

Each of the first to third pre-stacked gate structures 10a, 12a and 14a has a structure in which a lower structure 30, 32 or 34, a conductive pattern 40 and a first sacrificial layer pattern 52 are sequentially stacked. In particular, the first sacrificial layer pattern 52 is removed using the wet etching process of FIG. 6E, which will be described later. Therefore, the wet etching selectivity of the first sacrificial layer pattern 52 to a second sacrificial layer pattern (90 of FIG. 6E) and a spacer (60 of FIG. 6E) may be high. Further, the first sacrificial layer pattern 52 may also function as a stop layer during a process of planarizing the second sacrificial layer 90a of FIG. 6D, which will be described later. Materials having such characteristics may include, for example, silicon nitride (SiN), silicon oxynitride (SiON), polysilicon, silicon germanium (SiGe), etc., but the first sacrificial layer 52 is not limited to the above materials.

Next, impurities are implanted and thus junction regions 5 are formed in the cell array region A, which is exposed by the first and second pre-stacked gate structures 10a and 12a. The formation of the junction regions 5 in the peripheral circuit region B, which is exposed by the third pre-stacked gate structures 14a, can be performed simultaneously with the formation of the junction regions 5 in the cell array region A, or can be independently performed using a separate method.

Figure 6B:
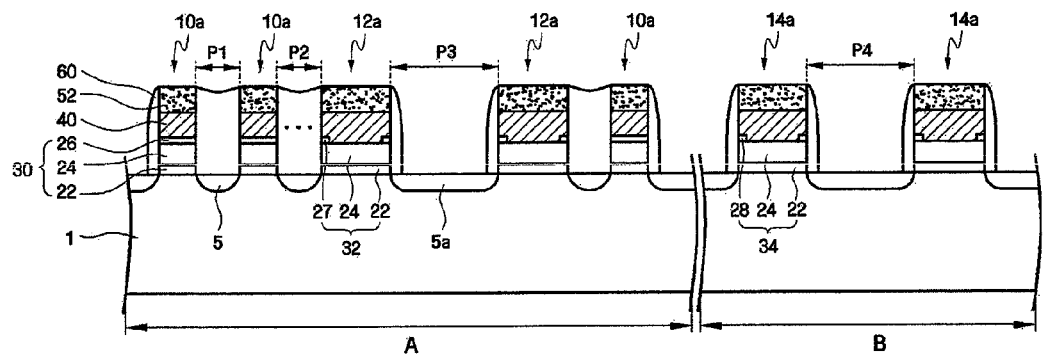

Referring to FIG. 6B, spacers 60 are formed on the side walls of the first to third pre-stacked gate structures 10a, 12a and 14a.

For example, a material for spacers, such as an oxide film or a nitride film, is applied on the first to third pre-stacked gate structures 10a, 12a and 14a, and is then etched back, thus forming the spacers 60. In this case, the first pitch P1 and the second pitch P2 have sizes such that the surface of the substrate 1 is not opened by the etch back operation. Accordingly, the spacers 60 between the first pre-stacked gate structures 10a are connected to each other and the spacers 60 between the first and second pre-stacked gate structures 10a and 12a are connected to each other, but the spacers 60 between the second pre-stacked gate structures 12a are separated from each other.

Figure 6C:
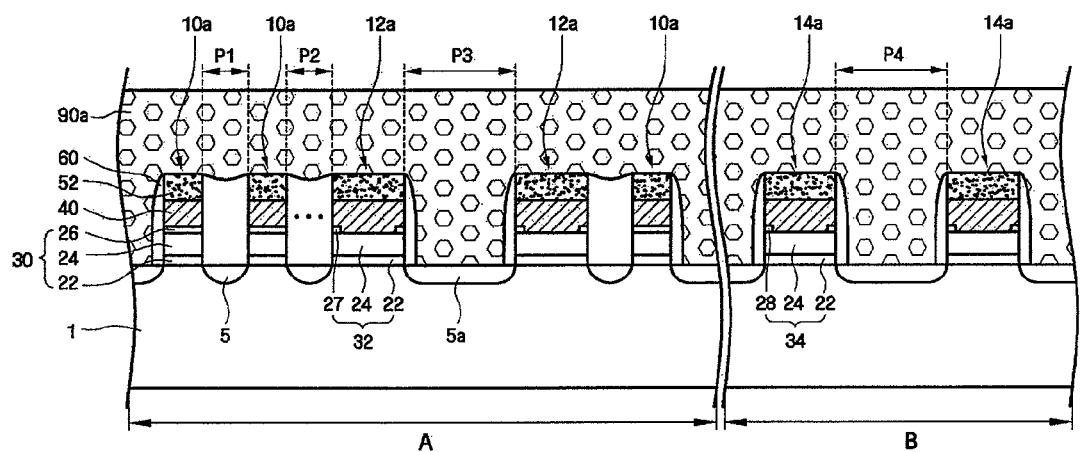
Figure 6D:
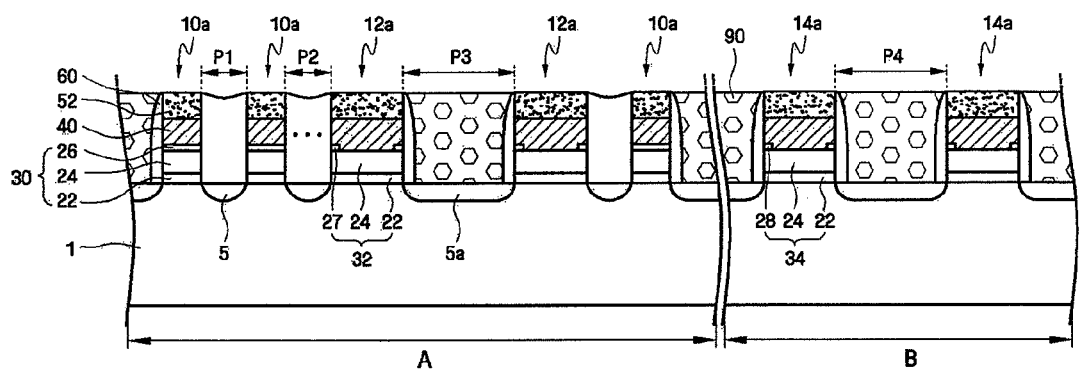

Referring to FIGS. 6C and 6D, the second sacrificial layer pattern 90, for filling both the space between the second pre-stacked gate structures 12a and the space between the third pre-stacked gate structures 14a, is formed.

For example, as shown in FIG. 6C, a second sacrificial layer 90a is formed to cover the first to third pre-stacked gate structures 10a, 12a and 14a. As shown in FIG. 6D, the second sacrificial layer 90a is planarized to expose the first sacrificial layer pattern 52 of each of the first to third pre-stacked gate structures 10a, 12a and 14a. The planarization can be performed using, for example, a Chemical Mechanical Polishing (CMP) process or an etch back process. For example, if the CMP process is used, the first sacrificial layer pattern 52, functioning as a CMP stop layer, is used as an end point. In this case, as the heights of the first to third pre-stacked gate structures 10a, 12a and 14a are substantially similar to each other, the detection of an end point can be readily performed in the CMP process.

The reason to form the second sacrificial layer pattern 90 is to minimize stress applied to the first to third pre-stacked gate structures 10a, 12a and 14a and to improve planarization efficiency in the process of planarizing a damascene metal layer (50a of FIG. 6E), which will be described later.

Such a second sacrificial layer pattern 90 requires various characteristics, for example, resistance to high temperatures (for example, 350° C.) required during a process of forming the damascene metal layer of FIG. 6E, which will be described later. Further, the second sacrificial layer pattern 90 should be promptly removed during a process of removing the second sacrificial layer pattern 90 of FIG. 6G, which will be described later. If a long time is taken to remove the second sacrificial layer pattern 90, the damascene metal layer pattern, exposed to the outside, may be stressed, or the resistance thereof may be increased.

Materials having such characteristics may include, for example, an organic layer. For example, for the organic layer, a Novolak-series i-line resist, a Poly Vinyl Phenol (PVP)-series KrF resist, a Poly HydroxyStryene (PHS)-series KrF resist, a (Methyl)Acrylate-series ArF resist, an Amorphous Carbon Layer (ACL), an Anti Reflective Coating (ARC), etc., can be used. Further, as the organic layer used herein does not undergo a photo process, a resist having no photoreactivity can also be used. Further, for example, for the second sacrificial layer pattern 90, polysilicon or silicon germanium (SiGe) can be used.

Figure 6E:
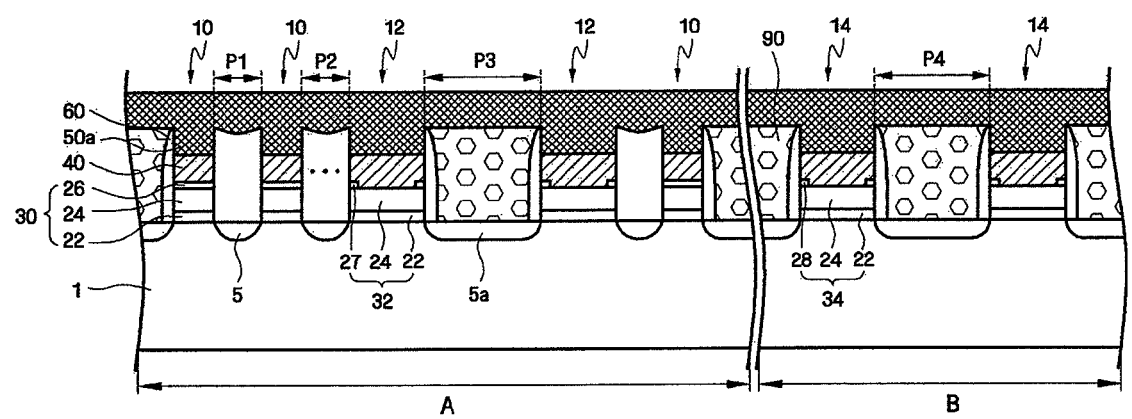
Figure 6F:
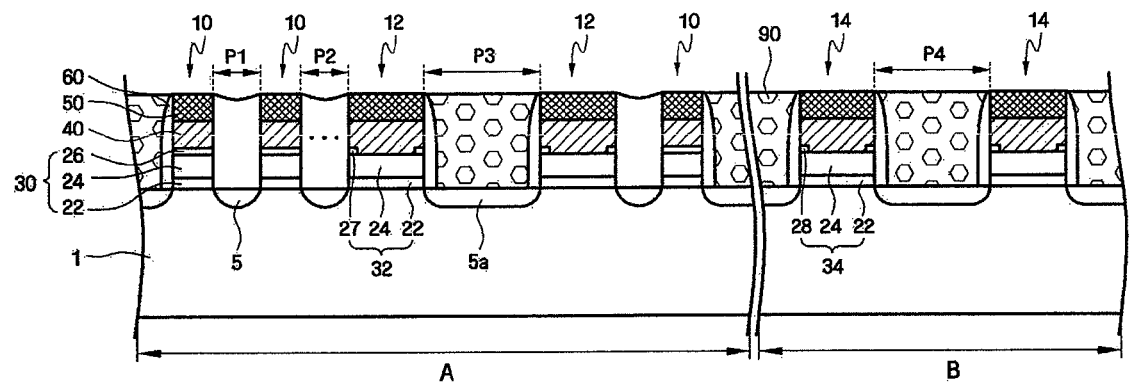

Referring to FIGS. 6E and 6F, the first sacrificial layer pattern 52 is removed from each of the first to third pre-stacked gate structures 10a, 12a and 14a. For example, the first sacrificial layer pattern 52 can be removed through wet etching. The etchant used at this time should have high wet etching selectivity of the first sacrificial layer pattern 52 to the second sacrificial layer pattern 90 and the spacer 60.

Next, the damascene metal layer pattern 50 is formed in the space of each of the first to third pre-stacked gate structures 10a, 12a and 14a, from which the first sacrificial layer pattern 52 is removed, thus completing each of the first to third stacked gate structures 10, 12 and 14. For example, as shown in FIG. 6E, the damascene metal layer 50a is formed to fill the first to third pre-stacked gate structures 10a, 12a and 14a, and is planarized through a planarization process as shown in FIG. 6F, thus forming the damascene metal layer pattern 50. The planarization process can be executed using, for example, a CMP process or an etch back process. In this case, as the heights of the first to third pre-stacked gate structures 10a, 12a and 14a are substantially similar to each other, the detection of an end point can be readily performed in the CMP process.

Figure 6G:
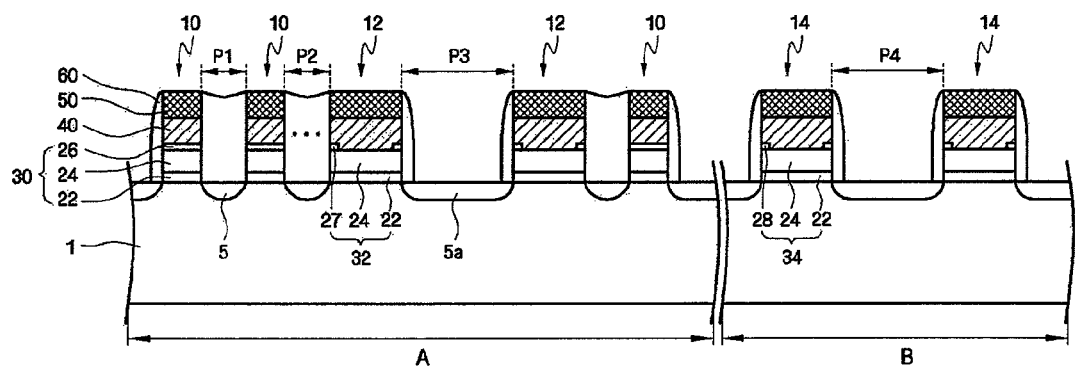

Referring to FIG. 6G, the second sacrificial layer pattern 90 is removed.

For example, when the second sacrificial layer pattern 90 contains organic material, it can be removed using an ashing process. For example, the second sacrificial layer pattern 90 can be removed in a short period of about 20 to about 30 seconds in an oxygen (O2) atmosphere. As described above, as each second sacrificial layer pattern 90 can be removed in a short period of time, stress applied to the damascene metal layer pattern 50, which is exposed to the outside, can be minimized.

Further, when the second sacrificial layer pattern 90 contains polysilicon or silicon germanium, it can be removed through wet etching.

Figure 6H:
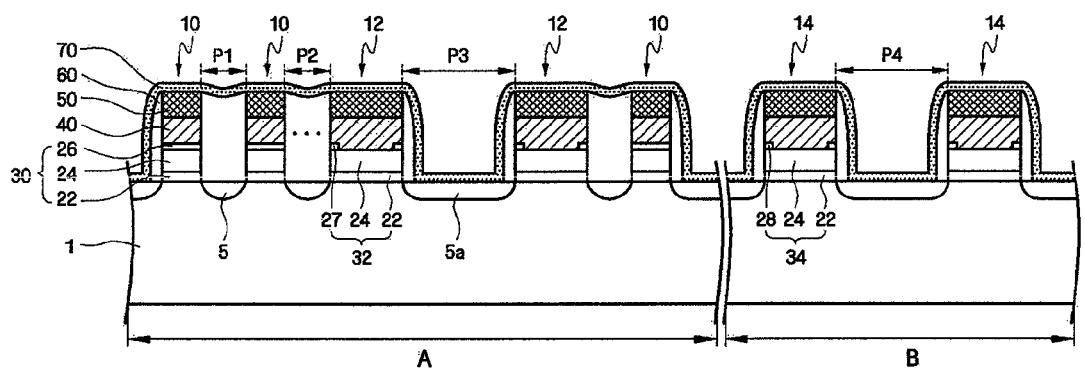

Referring to FIG. 6H, a stop layer 70 is formed on the top surfaces of the first stacked gate structures 10, the top surfaces and the side walls of the second stacked gate structures 12, the top surfaces and the side walls of the third stacked gate structures 14, and the top surface of the substrate 1. For example, the stop layer 70 can be formed as a silicon nitride (SiN) layer or a silicon oxynitride (SiON) layer through Chemical Vapor Deposition (CVD) or Atomic Layer Deposition (ALD). For example, the thickness of the stop layer 70 can be about 500 Å or less, that is, approximately 200 to 300 Å.

Referring to FIG. 4 again, the interlayer dielectric 80 is formed on the resulting structure, and contact holes for opening the bit line junction regions 5a are formed through dry etching. Next, each contact hole is filled to form a bit line contact BLC, and then a bit line BL0 connected to the bit line contact BLC is formed. In this case, the stop layer 70 formed on the top surface of the substrate 1 (that is, the bit line junction region 5a) functions as an etch-stop layer during a process of forming the contact hole.

Thereafter, the step of forming wires to enable the input/output of electrical signals to/from memory cells, the step of forming a passivation layer on the substrate, and the step of packaging the substrate are further performed based on processing steps which are well known to those skilled in the art, thus completing the non-volatile memory integrated circuit device.

The method of fabricating a non-volatile memory integrated circuit device according to an exemplary embodiment of the present invention has been described using the process of simultaneously forming the cell array region A and the peripheral circuit region B as an example, but the present invention is not limited to the above example. That is, the cell array region A and the peripheral circuit region B can be independently fabricated using separate processes.

FIGS. 7A to 7E are sectional views showing a method of fabricating a non-volatile memory integrated circuit device according to another exemplary embodiment of the present invention. The same reference numerals are used to designate components substantially identical to those of FIGS. 6A to 6H, and a detailed description of the components is omitted.

Figure 7A:
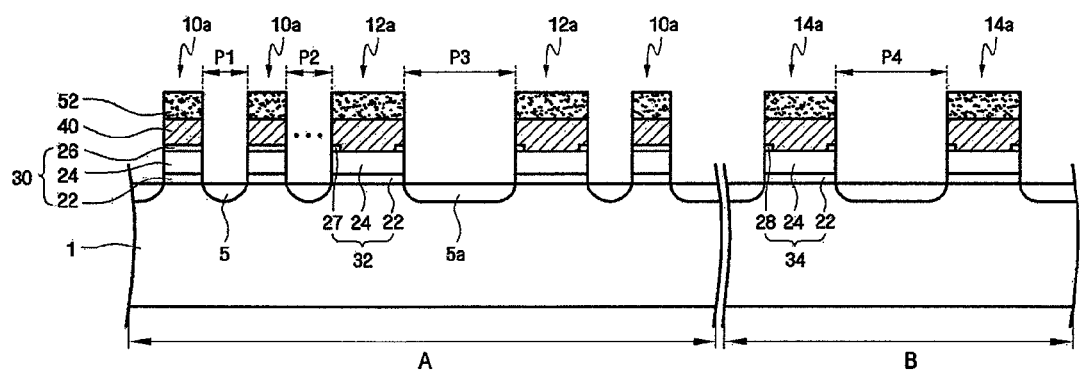
FIGS. 7A to 7E are sectional views showing a process of fabricating a non-volatile memory integrated circuit device according to an exemplary embodiment of the present invention.
Figure 7B:
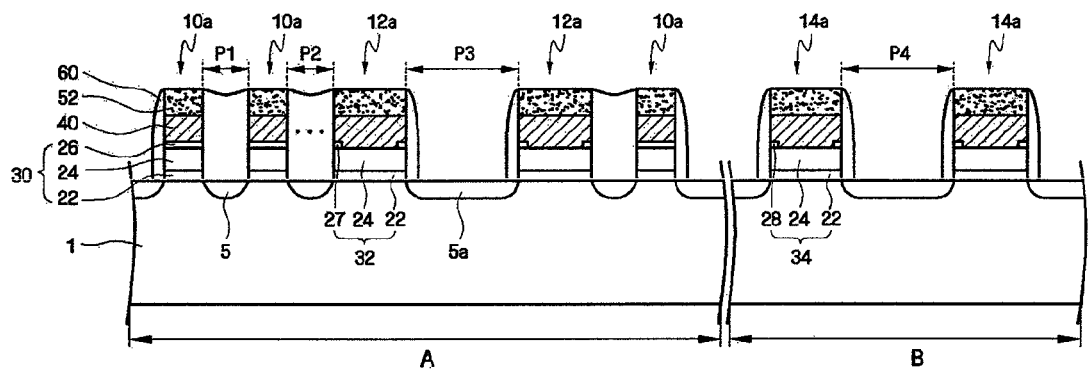
Figure 7C:
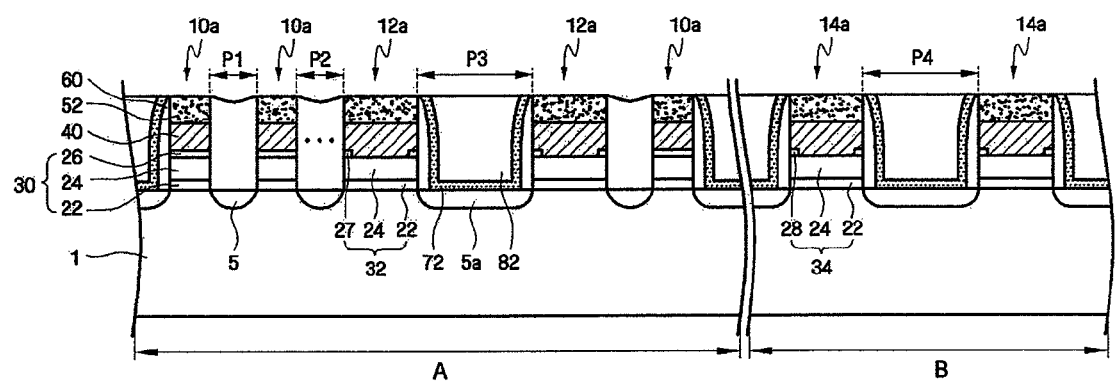

The difference between this embodiment and the previous embodiment of the present invention is that a typical interlayer dielectric material is used to fill the space between second pre-stacked gate structures 12a, as shown in FIG. 7C, which will be described later, without using a second sacrificial layer pattern 90, such as an organic layer, as shown in FIG. 6D. The typical interlayer dielectric material, filling the space between the second pre-stacked gate structures, is not removed until a final structure is formed. The reason for this is that the typical interlayer dielectric material is not removed in a short period of time. That is, when the heights of first to third pre-stacked gate structures are about 2500 to about 4000 Å, about 3500 to about 4500 seconds may be required to remove the typical interlayer dielectric material, which fills the space between the second pre-stacked gate structures, using 100:1 hydrogen fluoride (HF). If a damascene metal layer pattern is exposed to strong acid (HF) for a long period of time in this way, a significant stress may be applied to the damascene metal layer pattern, and it may thus become difficult to obtain desired electrical characteristics.

Referring to FIG. 7A, a device isolation region is formed in a substrate 1, and thus a cell array region A and a peripheral circuit region B are defined. Next, first and second pre-stacked gate structures 10a and 12a are formed in the cell array region A, and third pre-stacked gate structures 14a are formed in the peripheral circuit region B. In this case, each of the first to third pre-stacked gate structures 10a, 12a and 14a has a structure in which a lower structure 30, 32 or 34, a conductive pattern 40 and a sacrificial layer pattern 52 are sequentially stacked. Next, impurities are implanted, and thus junction regions 5 are formed in the cell array region A which is exposed by the first and second pre-stacked gate structures 10a and 12a.

Referring to FIG. 7B, spacers 60 are formed on the side walls of the first to third pre-stacked gate structures 10a, 12a and 14a.

Referring to FIG. 7C, a first stop layer pattern 72 and a first interlayer dielectric pattern 82, which sequentially fill both the space between the second pre-stacked gate structures 12a and the space between the third pre-stacked gate structures 14a, are formed.

For example, a first stop layer is formed on the top surfaces of the first pre-stacked gate structures 10a, the top surfaces and side walls of the second and third pre-stacked gate structures 12a and, and the top surface of the substrate 1. Next, a first interlayer dielectric is formed to sufficiently cover the first to third pre-stacked gate structures 10a, 12a and 14a. Thereafter, the first interlayer dielectric and the first stop layer are planarized to expose the sacrificial layer pattern 52 of each of the first to third pre-stacked gate structures 10a, 12a and 14a.

Figure 7D:
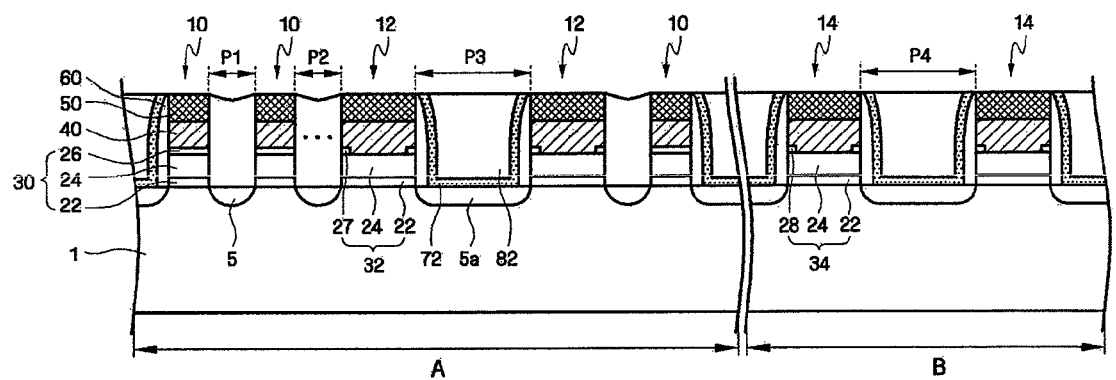

Referring to FIG. 7D, the sacrificial layer pattern 52 is removed from each of the first to third pre-stacked gate structures 10a, 12a and 14a. Next, a damascene metal layer pattern 50 is formed in the space of each of the first to third pre-stacked gate structures 10a, 12a and 14a, from which the first sacrificial layer pattern 52 is removed, thus completing each of the first to third stacked gate structures 10, 12 and 14.

Figure 7E:
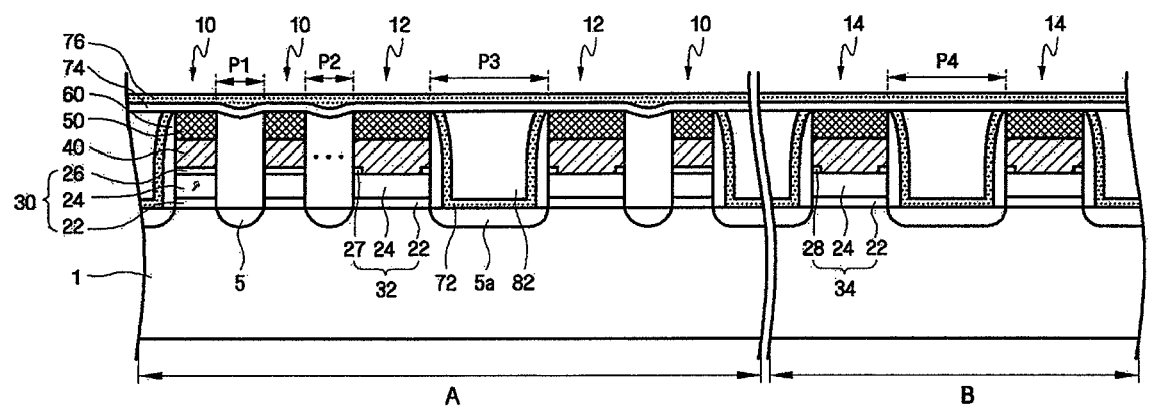

Referring to FIG. 7E, a buffer layer 74 and a second stop layer 76 are sequentially formed on the top surfaces of the first to third stacked gate structures 10, 12 and 14 and the top surface of the first interlayer dielectric pattern 82.

Referring to FIG. 5 again, a second interlayer dielectric 84 is formed on the resulting structure, and contact holes for opening bit line junction regions 5a are formed through, for example, dry etching. In this case, as the first stop layer pattern 72 is placed on each bit line junction region 5a, and the second stop layer 76 is arranged on the first interlayer dielectric pattern 82, dry etching should be performed at least twice so as to form a contact hole. That is, etching is performed up to the second stop layer 76 through first dry etching, and is performed up to the first stop layer pattern 72 through second dry etching, thus forming a contact hole. Then, the contact hole is filled to form a bit line contact BLC, and then a bit line BL0 connected to the bit line contact BLC is formed.

According to the above-described method of fabricating a non-volatile memory integrated circuit device and the non-volatile memory integrated circuit device fabricated using the method, the following one or more benefits can be obtained.

First, a word line (or a stacked gate structure) is formed as a dual-layer of a conductive pattern and a damascene metal layer pattern, thus minimizing the RC delay of the word line.

Second, a stop layer is formed in a junction region between a word line (or a stacked gate structure) and a bit line, and thus functions as both a passivation layer and an etch-stop layer.

Third, when a damascene metal layer pattern is formed, a second sacrificial layer pattern, such as, for example, an organic layer or polysilicon layer, is used, thus minimizing the stress applied to the damascene metal layer pattern.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A non-volatile memory integrated circuit device comprising:
   a substrate in which a cell array region and a peripheral circuit region are defined by a device isolation region;
   a plurality of first and second stacked gate structures formed in the cell array region, the first and second stacked gate structures each having a structure in which a lower structure, a conductive pattern and a damascene metal layer pattern are stacked, the first and second stacked gate structures being formed so that a first pitch between neighboring first stacked gate structures, and a second pitch between neighboring first and second stacked gate structures are narrower than a third pitch between neighboring second stacked gate structures;

a plurality of junction regions formed in the cell array region exposed by the first and second stacked gate structures;

a plurality of spacers formed on side walls of the first and second stacked gate structures, the spacers being formed so that spacers between the first stacked gate structures are connected to each other and spacers between the first and second stacked gate structures are connected to each other, but spacers between the second stacked gate structures are separated from each other; and a stop layer formed on top surfaces of the first stacked gate structures, top surfaces and side walls of the second stacked gate structures, and a top surface of the substrate.

2. The non-volatile memory integrated circuit device of claim 1, wherein the lower structure of each of the first stacked gate structures comprises a charge storage pattern electrically isolated from the conductive pattern, and the lower structure of each of the second stacked gate structures comprises a charge storage pattern electrically connected to the conductive pattern.

3. The non-volatile memory integrated circuit device of claim 1, further comprising a plurality of third stacked gate structures formed in the peripheral circuit region, the third stacked gate structures each having a structure in which the lower structure, the conductive pattern and the damascene metal layer pattern are sequentially stacked, the third stacked gate structures being formed so that a fourth pitch between neighboring third stacked gate structures is wider than the first pitch.

4. The non-volatile memory integrated circuit device of claim 3, wherein the lower structure of each of the stacked gate structures comprises a charge storage pattern electrically connected to the conductive pattern.

* * * * *